(12) United States Patent
Ono

(10) Patent No.: US 9,679,518 B2
(45) Date of Patent: Jun. 13, 2017

(54) DISPLAY DEVICE

(71) Applicant: JOLED INC., Tokyo (JP)

(72) Inventor: Shinya Ono, Osaka (JP)

(73) Assignee: JOLED INC., Tokyo (JP)

( * ) Notice: Subject to any disclaimer, the term of this patent is extended or adjusted under 35 U.S.C. 154(b) by 431 days.

(21) Appl. No.: 14/114,626

(22) PCT Filed: Feb. 12, 2013

(86) PCT No.: PCT/JP2013/000729
§ 371 (c)(1),
(2) Date: Oct. 29, 2013

(87) PCT Pub. No.: WO2013/171936
PCT Pub. Date: Nov. 21, 2013

(65) Prior Publication Data
US 2015/0221254 A1    Aug. 6, 2015

(30) Foreign Application Priority Data

May 15, 2012    (JP) .................................. 2012-111214

(51) Int. Cl.
*G09G 3/32*        (2016.01)
*G09G 3/3258*      (2016.01)
(Continued)

(52) U.S. Cl.
CPC ......... *G09G 3/3258* (2013.01); *G09G 3/3233* (2013.01); *G09G 2300/0426* (2013.01);
(Continued)

(58) Field of Classification Search
CPC ..... G09G 2300/0426; G09G 2320/043; G09G 2310/0262; G09G 2300/0819; G09G 3/3233; G09G 2310/0251; G09G 3/3258; G09G 2310/062; G09G 2300/0876; G09G 2300/0852; H01L 27/3276
See application file for complete search history.

(56) References Cited

U.S. PATENT DOCUMENTS 8,018,404 B2    9/2011    Ono
8,248,331 B2    8/2012    Ono
(Continued)

FOREIGN PATENT DOCUMENTS

| JP | 2009-086252 | 4/2009 |
|----|-------------|--------|
| WO | 2006/090560 | 8/2006 |
| WO | 2010/041426 | 4/2010 |

OTHER PUBLICATIONS

International Search Report, mailed Apr. 2, 2013, in corrresponding International Application No. PCT/JP2013/000729.

*Primary Examiner* — Alexander Eisen
*Assistant Examiner* — Abhishek Sarma
(74) *Attorney, Agent, or Firm* — Greenblum & Bernstein, P.L.C.

(57) ABSTRACT

A display device includes a display unit in which a plurality of pixel circuits are disposed, each of the pixel circuits includes: a first switching element; a second switching element; and a control line which is connected to a gate electrode of the first switching element, and transmits a first control signal which controls switching ON and OFF of the first switching element, and the display device comprises: a first capacitive electrode that is part of the control line; and a second capacitive electrode which is opposite to the first capacitive electrode and is connected to a gate electrode of the second switching element, wherein a first capacitor is formed between the first capacitive electrode and the second capacitive electrode.

14 Claims, 9 Drawing Sheets

(51) Int. Cl.
*G09G 3/3233* (2016.01)
*H01L 27/32* (2006.01)

(52) U.S. Cl.
CPC ........... *G09G 2300/0819* (2013.01); *G09G 2300/0852* (2013.01); *G09G 2300/0876* (2013.01); *G09G 2310/0251* (2013.01); *G09G 2310/0262* (2013.01); *G09G 2310/062* (2013.01); *G09G 2320/043* (2013.01); *H01L 27/3276* (2013.01)

(56) References Cited

U.S. PATENT DOCUMENTS

| | | | |
|---|---|---|---|
| 2007/0040770 A1* | 2/2007 | Kim | G09G 3/3233 345/76 |
| 2007/0080417 A1* | 4/2007 | Jung | H01L 27/3269 257/448 |
| 2007/0222380 A1* | 9/2007 | Yamazaki | H01L 51/0562 313/509 |
| 2008/0007499 A1* | 1/2008 | Kawabe | G09G 3/3233 345/82 |
| 2008/0088546 A1 | 4/2008 | Takasugi et al. | |
| 2010/0177024 A1* | 7/2010 | Choi | G09G 3/3233 345/76 |
| 2010/0259531 A1 | 10/2010 | Ono | |
| 2011/0157135 A1* | 6/2011 | Lee | G09G 3/3291 345/211 |
| 2011/0164024 A1 | 7/2011 | Ono | |
| 2011/0285760 A1 | 11/2011 | Ono | |
| 2013/0300724 A1* | 11/2013 | Chaji | G09G 3/3233 345/212 |

* cited by examiner

DISPLAY DEVICE

TECHNICAL FIELD

The present disclosure relates to display devices, and relates in particular to an image display device which controls a plurality of pixel circuits disposed in a display unit based on a plurality of control signals.

BACKGROUND ART

As an image display device using a current-driven light-emitting element, an image display device using organic electroluminescence (EL) elements is known. The organic EL display device using self-luminous organic EL elements is suitable for making a thin device without the need of a backlight which is necessary for a liquid crystal display device. Moreover, since there is no restriction on a viewing angle, the organic EL display device is expected to be put into practical use as a next-generation display device.

Patent Literature 1 discloses a circuit configuration of a pixel circuit in an active matrix organic EL display device.

FIG. 9 is a circuit configuration of a pixel circuit 510 in a conventional organic EL display device disclosed in Patent Literature 1.

The pixel circuit 510 includes a light-emitting element 515 that is an organic EL element, a capacitor 513, a driving element 514 that is an n-type thin-film transistor (TFT) having a gate connected to a first electrode 5131 of the capacitor 513 and a source connected to the light-emitting element 515, a third switching element 519 which switches between conduction and non-conduction between a source of the driving circuit 514 and a second electrode 5132 of the capacitor 513, a first switching transistor 512 which switches between conduction and non-conduction between a reference power source line 520 and the first electrode 5131 of the capacitor 513, and a second switching element 511 which switches between conduction and non-conduction between a signal line 516 and the second electrode 5132 of the capacitor 513.

Since the pixel circuit 510 can be driven such that current flowing in the driving element 514 is always only via the light-emitting element 515, the steady-state current does not flow in the reference power source line 520 and the signal line 516.

Therefore, it is possible to hold an accurate potential which is not affected by a change in voltage drop and a change in driving voltage of the light-emitting element 515, at both end electrodes of the capacitor 513 having a function of holding a voltage between the gate and the source of the driving element 514, with the result that it is possible to realize high-definition image display reflecting image signals.

CITATION LIST

Patent Literature

[PTL 1]
  WO2010/041426

SUMMARY OF INVENTION

Technical Problem

However, the conventional organic EL display device disclosed in Patent Literature 1 controls, using a control line 517, a second switching element 511 and a first switching element 512. This structure is applied to the case where the switching ON and OFF of the second switching element 511 and the switching ON and OFF of the first switching element 512 can be controlled with the same control signal, respectively.

When the switching ON and OFF of the second switching element 511 and the switching ON and OFF of the first switching element 512 are controlled with different voltages, control signals having different voltages are necessary even when the timing and polarity required for each of the control signals are the same. In that case, when the different control signals are provided from a non-illustrated scanning line driving circuit, the number of output pins is increased in the scanning line driving circuit and the circuit size for connecting the scanning line driving circuit and the pixel circuit is increased.

The present disclosure is conceived in light of the situation, and has an object to provide a display device which can simplify the driving circuit and the connection between the driving circuit and the pixel circuit when a plurality of transistors exist that have the same timing and polarity and that needs to be controlled by the control signals having different voltages from each other.

Solution to Problem

In order to solve the above mentioned problem, an aspect of the display device according to the present disclosure is a display device including a display unit in which a plurality of pixel circuits are disposed, each of the pixel circuits including: a first switching element; a second switching element; and a control line which is connected to a gate electrode of the first switching element, and transmits a first control signal which controls switching ON and OFF of the first switching element, the display device comprising: a first capacitive electrode that is part of the control line; and a second capacitive electrode which is opposite to the first capacitive electrode and is connected to a gate electrode of the second switching element, wherein a first capacitor is formed between the first capacitive electrode and the second capacitive electrode.

Advantageous Effects of Invention

Since the display device according to the present disclosure is capable of generating the second control signal from the first control signal via the first capacitor, a voltage suitable for controlling switching ON and OFF of the first and second switching elements can be set from a driver output As a result, it is possible to obtain a display device in which the driver for providing control signals is simplified.

DESCRIPTION OF EMBODIMENT

Figure 1:
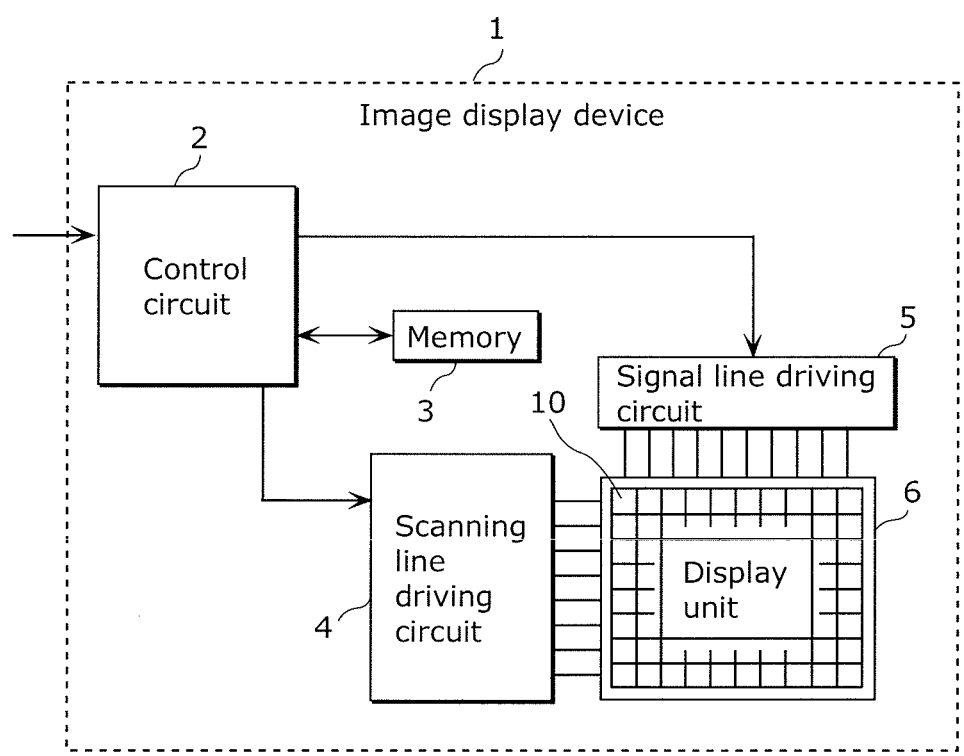
FIG. 1 is a block diagram showing an example of a functional configuration of an image display device according to Embodiment.

An aspect of a display device according to the present disclosure is a display device is a display device including a display unit in which a plurality of pixel circuits are disposed, each of the pixel circuits including: a first switching element; a second switching element; and a control line which is connected to a gate electrode of the first switching element, and transmits a first control signal which controls switching ON and OFF of the first switching element, the display device comprising: a first capacitive electrode that is part of the control line; and a second capacitive electrode which is opposite to the first capacitive electrode and is connected to a gate electrode of the second switching element, wherein a first capacitor is formed between the first capacitive electrode and the second capacitive electrode.

Moreover, in an aspect of the display device according to the present disclosure, the first capacitive electrode and the second capacitive electrode may be provided to each of the pixel circuits.

Since the display device according to the present aspect is capable of generating the first control signal from the first control signal by coupling with the first capacitor, a voltage suitable for controlling switching ON and OFF of the first and second switching elements can be set from a driver output As a result, it is possible to obtain a display device in which the driver for providing control signals is simplified.

Moreover, in an aspect of the display device according to the present disclosure, switching ON and OFF of the second switching element may be controlled according to a second control signal provided from the control line via the first capacitor.

With the present aspect, the switching ON and OFF of the second switching element can be controlled by the second control signal provided from the control line via the first capacitor.

Moreover, in an aspect of the display device according to the present disclosure, the first switching element and the second switching element may be transistors having a same conductivity type.

The present aspect is suitable when the first switching element and the second switching element are transistors having the same conductivity type.

Moreover, in an aspect of the display device according to the present disclosure, the first switching element and the second switching element may be transistors having different conductivity types.

The present aspect is suitable when the first switching element and the second switching element are transistors having different conductivity types.

Moreover, an aspect of the display device according to the present disclosure may further comprise a coupling line which transmits the second control signal, wherein the second capacitive electrode is part of the coupling line, the display device further comprising: a third capacitive electrode that is another part of the coupling line; and a fourth capacitive electrode which is opposite to the third capacitive electrode and is connected to a fixed voltage line which transmits a fixed voltage, wherein a second capacitor is formed between the third capacitive electrode and the fourth capacitive electrode.

With the present aspect, the amplitude of the second control signal, based on the amplitude of the first control signal, can be adjusted according to capacitance ratio of the capacitance of the first capacitor and the capacitance of the second capacitor.

Moreover, in an aspect of the display device according to the present disclosure, a voltage amplitude of the gate electrode of the first switching element may be greater than or equal to a voltage amplitude of the gate electrode of the second switching element.

With the present aspect, it is possible to control the first switching element at a gate voltage having the amplitude that is greater than or equal to the amplitude of the gate voltage of the second switching element.

Moreover, an aspect of the display device according to the present disclosure may further comprise a third switching element which switches between conduction and non-conduction between the second capacitive electrode and an initialization voltage line which transmits an initialization voltage, wherein in a period in which the initialization voltage is set to an ON voltage or an OFF voltage of the second switching element, the ON voltage or the OFF voltage of the second switching element may be set to the second capacitive electrode by turning on the third switching element.

With the present aspect, the voltage of the first control signal can be swung according to the amplitude of the first control signal with reference to the initialization voltage set via the third switching element.

Moreover, an aspect of the display device according to the present disclosure, each of the pixel circuits including: a driving transistor having one of a source electrode and a drain electrode which is connected to a first power source line which transmits a first power source voltage; a capacitive element having one of electrodes which is connected to a gate electrode of the driving transistor; a light-emitting element having one of electrodes which is connected to the other of the source electrode and the drain electrode of the driving transistor, and having the other of the electrodes which is connected to a second power source line which transmits a second power source voltage; a first switching transistor which switches between conduction and non-conduction between the other of the electrodes of the capacitive element and a data line which transmits a data voltage corresponding to luminance; a second switching transistor which switches between conduction and non-conduction between the one of the electrodes of the capacitive element and a reference voltage line which transmits a reference voltage; and a third switching transistor which switches between conduction and non-conduction between the source electrode of the driving transistor and the other of the electrodes of the capacitive element, wherein the first switching element is the first switching transistor, and the second switching element is the second switching transistor.

With the present aspect, it is possible to simplify a driver for providing a control signal in the display device which includes a display unit in which a plurality of pixel circuits driving the light-emitting element in the driving transistor are disposed.

Moreover, in an aspect of the display device according to the present disclosure, the display device may have a structure in which a plurality of conductive layers are stacked, and the first capacitive electrode and the second capacitive electrode may be respective parts of a first conductive layer and a second conductive layer, the first conductive layer and the second conductive layer being adjacent to each other among the conductive layers. Moreover, the third capacitive electrode may be part of the second conductive layer, and the fourth capacitive electrode may be part of the first conductive layer.

Moreover, in an aspect of the display device according to the present disclosure, the first conductive layer may be a second wiring layer, and the second conductive layer may be a first wiring layer, and the first conductive layer may be a second wiring layer, and the second conductive layer may be a third wiring layer.

With the present aspect, the first capacitor and the second capacitor can be formed by using, as a capacitive electrode, part of each of a pair of conductive layers that are stacked in adjacent to above the substrate and that are disposed in opposite to each other.

Moreover, the control line may be part of the first conductive layer, the coupling line may be part of the second conductive layer, and the control line may have a greater width than a width of the coupling line.

With the present aspect, the width of the control line can be configured to be greater than the width of the coupling line.

[Embodiment]

The following will describe in detail a display device according to an aspect of the present disclosure with reference to the drawings.

It should be noted that the embodiment to be described later is mere examples of the present disclosure. Numerical values, shapes, materials, structural elements, the arrangement and connection of the structural elements, steps, the processing order of the steps, and so on shown in the following embodiment are mere examples, and are not intended to limit the present disclosure. Moreover, among structural elements in the following embodiments, structural elements not recited in the independent claims representing the most generic concept are described as arbitrary structural elements.

FIG. 1 is a block diagram showing an example of a functional configuration of an image display device 1 that is an example of a display device according to Embodiment of the present disclosure. The image display device 1 includes a control circuit 2, a memory 3, a scanning line driving circuit 4, a signal line driving circuit 5, and a display unit 6. In the display unit 6, a plurality of pixel circuits 10 are disposed.

Figure 2:
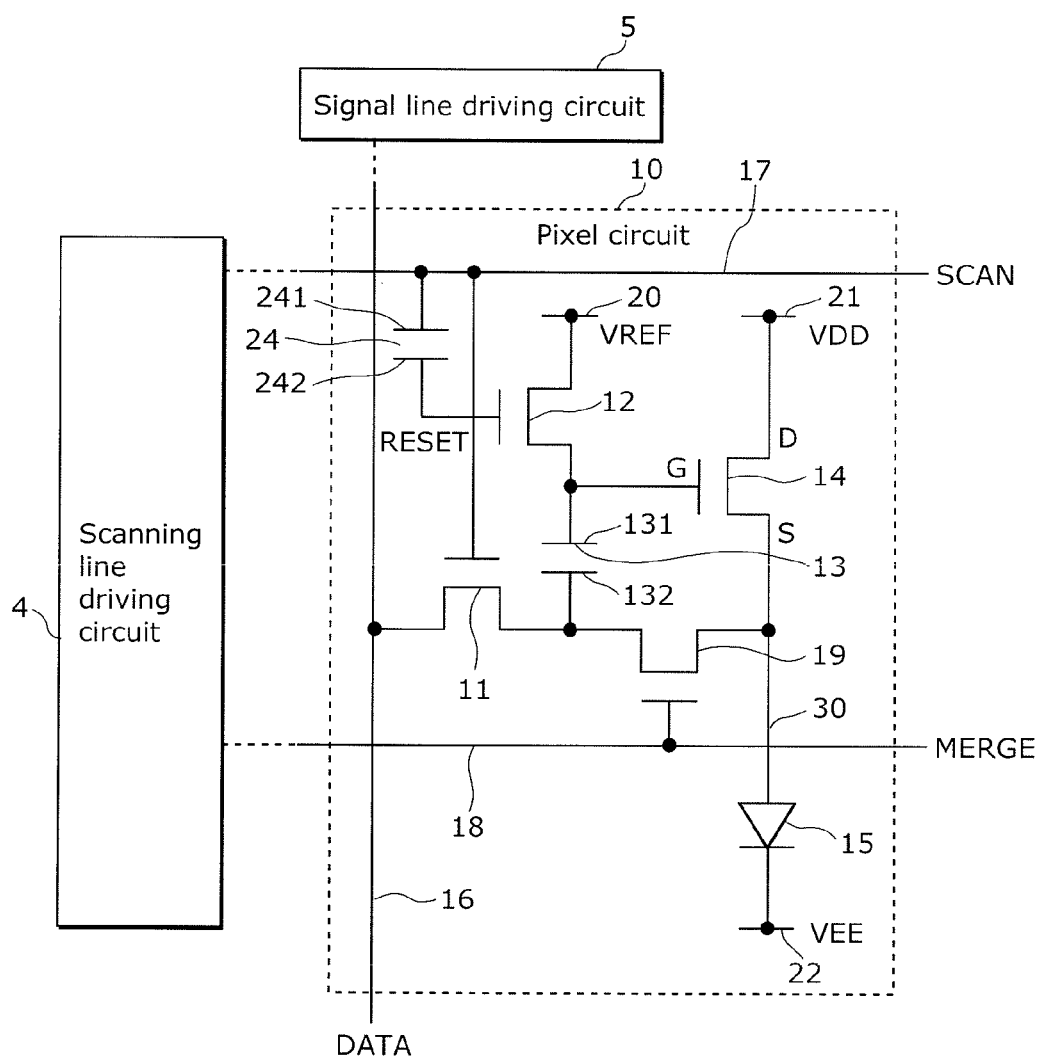
FIG. 2 is a circuit diagram showing an example of a pixel circuit according to Embodiment, and an example of connection between (i) the pixel circuit and (ii) a scanning line driving circuit and a signal line driving circuit according to Embodiment.

FIG. 2 is a circuit diagram showing an example of a pixel circuit 10 according to Embodiment of the present disclosure, and an example of a connection between (i) the pixel circuit 10 and (ii) the scanning line driving circuit 4 and the signal line driving circuit 5 according to Embodiment of the present disclosure.

The pixel circuit 10 includes switching transistors 11 and 12, a control line 17 which is connected to the gate electrode of the switching transistor 11 and which transmits a control signal SCAN controlling switching ON and OFF of the switching transistor 11, a capacitive electrode 241 that is part of the control line 17, and a capacitive electrode 242 which is opposite to the capacitive electrode 241 and is connected to the gate electrode of the switching transistor 12. A capacitor 24 is formed between the capacitive electrode 241 and the capacitive electrode 242, and switching ON and OFF of the switching transistor 12 are controlled by a control signal RESET provided from the control line 17 via the capacitor 24.

Here, the switching transistors 11 and 12 are examples of the first and second switching elements, the capacitor 24 is an example of the first capacitor, and the capacitive electrodes 241 and 242 are examples of the first and second capacitive electrodes, respectively.

Moreover, switching ON and OFF of the switching transistor 11 may be controlled by the control signal RESET provided via the capacitor 24, and switching ON and OFF of the switching transistor 12 may be controlled by the control signal SCAN provided by the control line 17.

The pixel circuit 10 further includes an electrostatic holding capacitor 13, a driving transistor 14, an organic EL element 15 that is an example of the light-emitting element, a signal line 16, a control line 18, a switching transistor 19, a reference power source line 20, a first power source line 21, and a second power source line 22.

Here, the electrostatic holding capacitor 13 is an example of a holding capacitor, the organic EL element 15 is an example of a light-emitting element, and the first power source line 21 and the second power source line 22 are examples of the first and second power source lines, respectively.

It should be noted that in an example of FIG. 2, the capacitor 24 (the first capacitor) is shown in a pixel circuit 10. However, the first capacitor is not limited to a configuration based on a one-to-one correspondence with a pixel, and may be provided in a region such as a surround region of the display unit 6 that is shared by the pixels.

The following will describe the connection relationships and functions of the structural elements shown in FIGS. 1 and 2.

The control circuit 2 has a function of controlling the scanning line driving circuit 4, the signal line driving circuit 5, and the memory 3. The memory 3 stores correction data items for each of the pixel circuits. The control circuit 2 reads the correction data item written into the memory 3, corrects a video signal inputted from outside based on the correction data item, and outputs the corrected video signal to the signal line driving circuit 5.

The scanning line driving circuit 4 is connected to the control lines 17 and 18. The scanning line driving circuit 4 is a driving circuit which has a function of controlling conduction and non-conduction of the switching transistors 11, 12, and 19 of the pixel circuit 10, by outputting the control signals SCAN and MERGE to the control line 17 and the control line 18, respectively.

The signal line driving circuit 5 is connected to the signal line 16. The signal line driving circuit 5 is a driving circuit which has a function of outputting a signal voltage based on a video signal to the pixel circuit 10.

The display unit 6 includes a plurality of the pixel circuits 10, and displays an image based on a video signal inputted from outside to the image display device 1.

The gate of the switching transistor 11 is connected to the control 17, one of the source and drain is connected to the signal line 16, and the other of the source and the drain is connected to an electrode 132 of the electrostatic holding capacitor 13. The switching transistor 11 has a function of determining the timing of applying a signal voltage of the signal line 16 to the electrode 132 of the electrostatic holding capacitor 13.

The gate of the switching transistor 12 is connected to the control electrode 242, one of the source and the drain is connected to the reference power source line 20, and the other of the source and the drain is connected to an electrode 131 of the electrostatic holding capacitor 13. The switching transistor 12 has a function of determining the timing of applying a reference voltage VREF of the reference power source line 20 to the electrode 131 of the electrostatic holding capacitor 13. The switching transistors 11 and 12 each comprise, for example, n-type TFT. Generally, regarding the conductivity types of the switching transistor, in the case of the pixel circuit which allows the ON and OFF states to become the same state at the same timing, the conductivity types of the switching transistor should be the same. Moreover, in the case of the pixel circuit which causes the ON and OFF states to change to the opposite states, respectively, the conductivity types of the switching transistor should be different.

The electrode 131 of the electrostatic holding capacitor 13 is connected to the gate of the driving transistor 14, and the electrode 132 is connected to the source of the driving transistor 14 via the switching transistor 19. The electrostatic holding capacitor 13 holds a voltage corresponding to the signal voltage provided from the signal line 16, and for example has a function of reliably holds a potential between the gate and source electrodes of the driving transistor 14 and stabilize the current provided from the driving transistor 14 to the organic EL element 15, after the switching transistors 11 and 12 changes to the OFF state.

The drain of the driving transistor 14 is connected to the first power source line 21, and the source of the driving transistor 14 is connected to an anode of the organic EL element 15. The driving transistor 14 converts a voltage corresponding to the signal voltage applied to between the gate and the source, into a drain current corresponding to the signal voltage. Then, the drain current is provided as the signal current to the organic EL element 15. The driving transistor 14 comprises, for example, n-type TFT.

The organic EL element 15 is a light-emitting element having a cathode which is connected to the second power source line 22. The organic EL element 15 emits light by causing the signal current to flow by the driving transistor 14.

The gate of the switching transistor 19 is connected to the control line 18, one of the source and the drain is connected to the source of the driving transistor 14, and the other of the source and the drain is connected to the electrode 132 of the electrostatic holding capacitor 13. The switching transistor 19 has a function of determining the timing of applying a potential held in the electrostatic holding capacitor 13 to between the gate and source electrodes of the driving transistor 14. The switching transistor 19 comprises, for example, n-type TFT.

The signal line 16 is connected to the signal line driving circuit 5 and is connected to each of the pixel circuits which belongs to a pixel column including the pixel circuit 10. The signal line 16 has a function of providing a signal voltage DATA which determines light emission intensity.

Moreover, the image display device 1 includes the signal lines 16 whose total number is at least the same number as that of pixel columns.

The control line 17 is connected to the scanning line driving circuit 4, and is connected to each of the pixel circuits which belongs to a pixel row including the pixel circuit 10. With this, the control line 17 has a function of providing the timing of writing a signal voltage DATA to each of the pixel circuits which belongs to a pixel row including the pixel circuit 10, and has a function of providing the timing of applying a reference voltage VREF to the gate of the driving transistor 14 of the pixel circuit.

The control line 18 is connected to the scanning line driving circuit 4. With this, the control line 18 has a function of providing the timing of applying a potential of the electrode 132 of the electrostatic holding capacitor 13 to the source of the driving transistor 14.

Moreover, the image display device 1 includes the control lines 17 and 18 each of whose total number is the same number of pixel rows as that of pixel rows.

It should be noted that although not illustrated in FIGS. 1 and 2, the reference power source line 20 which provides the reference voltage VREF, the first power source line 21 which provides a high voltage side voltage VDD, and the second power source line 22 which provides a low voltage side voltage VEE are each connected to other pixel circuits and connected to a voltage source.

With the pixel circuit 10, since a control signal RESET is generated from a control signal SCAN through a coupling operation via the capacitor 24, the scanning line driving circuit 4 can obtain the control signal RESET having the same timing and polarity as that of the control signal SCAN only by outputting the control signal SCAN.

The following will describe a circuit for adjusting the amplitude and the reference voltage of the control signal RESET.

Figure 3:
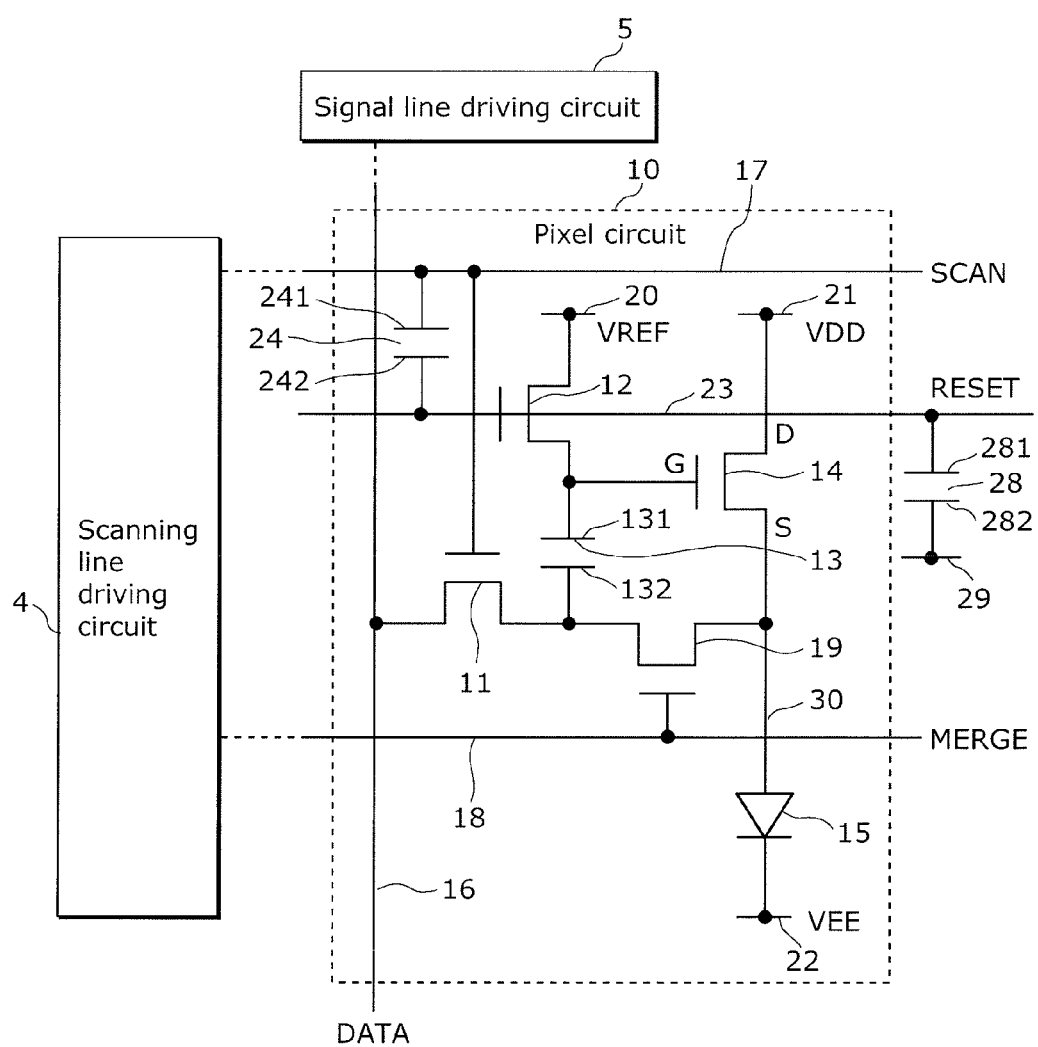
FIG. 3 is a circuit diagram showing an example of an amplitude adjustment circuit according to Embodiment.

FIG. 3 is a circuit diagram showing an example of a circuit for adjusting an amplitude of the control signal RESET. In FIG. 3, different from the configuration in FIG. 2, a coupling line 23 which includes the capacitive electrode 242 as part and transmits the control signal RESET, a capacitive electrode 281 that is another part of the coupling line 23, and a capacitive electrode 282 which is opposite to the capacitive electrode 281 and is connected to a fixed voltage line 29 which transmits a fixed voltage are added. A capacitor 28 is formed between the capacitive electrode 281 and the capacitive electrode 282. The fixed voltage line 29 may be connected using a reliable fixed voltage, may be a reference voltage VREF, a high voltage side voltage VDD, and a low voltage side voltage VEE, and another voltage.

With this configuration, the amplitude of the control signal RESET can be adjusted according to the capacitance ratio of the capacitance of the capacitor 24 and the capacitance of the capacitor 28, based on the amplitude of the control signal SCAN. Specifically, when the voltage amplitude of the control signal SCAN is $\Delta Vscn$, a capacitance of the capacitor 24 is C1, a capacitance value of the capacitor 28 is C2, the voltage amplitude of the coupling line 23 is $\Delta Vscn \times C1/(C1+C2)$.

Figure 4:
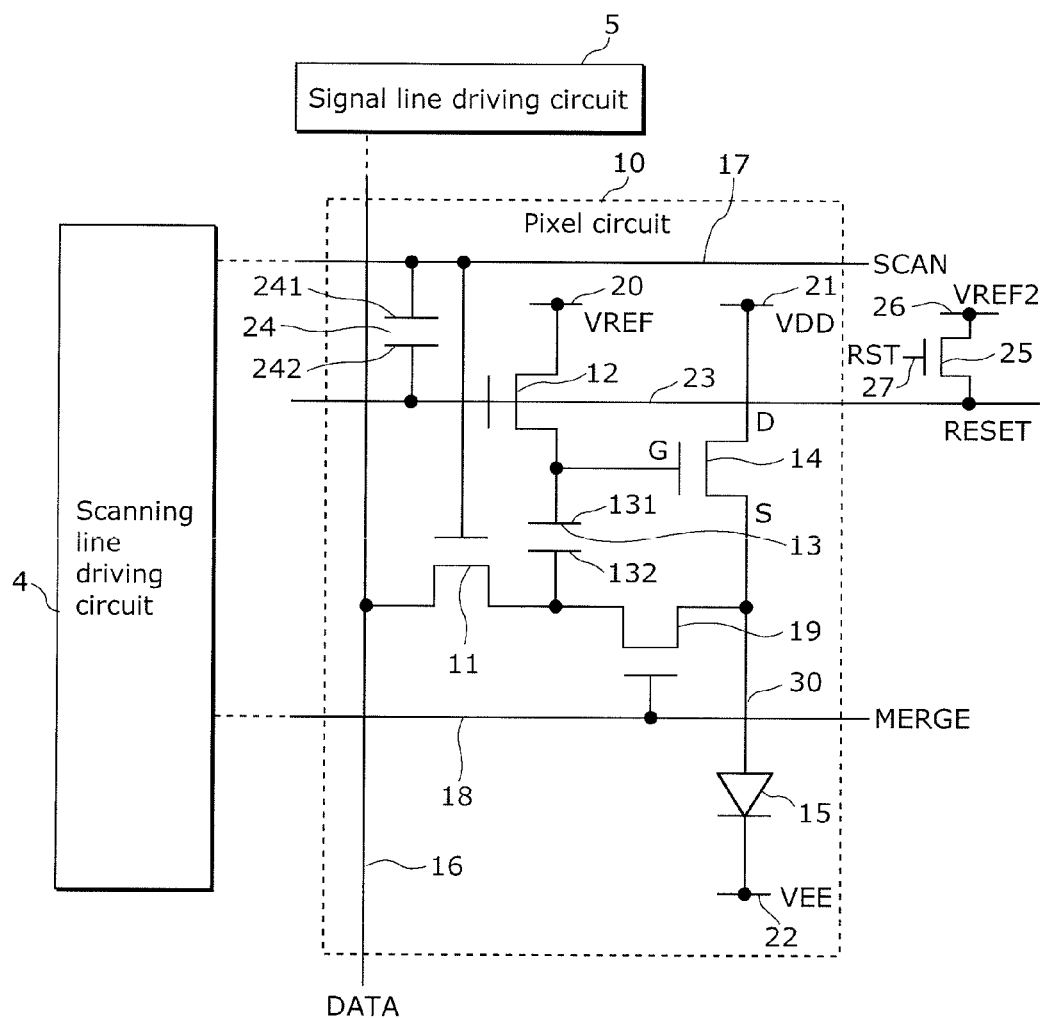
FIG. 4 is a circuit diagram showing an example of a reference voltage adjustment circuit according to Embodiment.

FIG. 4 is a circuit diagram showing an example of a circuit for adjusting the reference voltage of the control signal RESET. In FIG. 4, different from the configuration in FIG. 2, a switching transistor 25 which switches between conduction and non-conduction between the capacitive electrode 242 and an initialization voltage line 26 which transmits an initialization voltage VREF2 is added. By turning on the switching transistor 25 in a period in which the initialization voltage VREF2 is set to an ON voltage or an OFF voltage of the switching transistor 12, the ON voltage or the OFF voltage of the switching transistor 12 is set to the capacitive electrode 242. Switching ON and OFF of the switching transistor 25 is controlled by the control signal RST provided from the control circuit 2 via a control line 27.

With this configuration, a voltage of the control signal RESET can be swung according to the amplitude of the control signal SCAN, with reference to the initialization voltage VREF2 set via the switching transistor 25.

Figure 5:
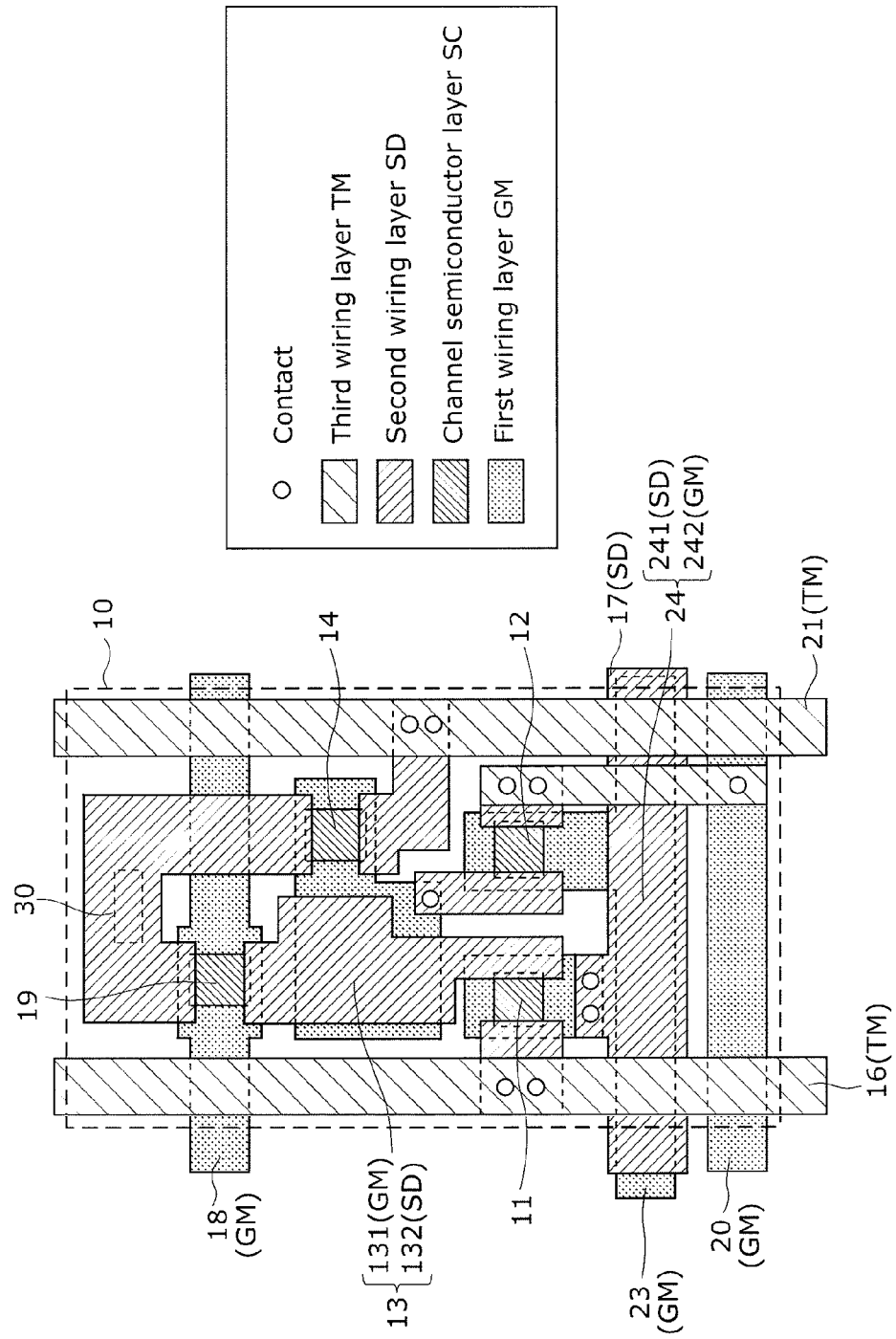
FIG. 5 is a circuit diagram showing an example of a layout pattern of a pixel circuit according to Embodiment.

FIG. 5 is a circuit diagram showing an example of a layout pattern of the pixel circuit 10 according to Embodiment.

The pixel circuit 10 of the image display device 1 has a configuration in which a plurality of conductive layers are stacked. The image display device 1, as an example, has a configuration in which above the substrate, conductive layers each for a first wiring layer GM, a second wiring layer SD, and a third wiring layer TM, via a dielectric body such as a gate insulating layer or an interlayer dielectric, are stacked in that order. The first wiring layer GM, the second wiring layer SD, and the third wiring layer TM are patterned into intended shapes, respectively.

It is desirable that the capacitive electrode 241 forming the capacitor 24 is part of the second wiring layer SD and the capacitive electrode 242 is part of the first wiring layer GM.

The signal line 16 is part of the third wiring layer TM. It is desirable that the control line 17 is part of the second wiring layer SD.

It is desirable that the control line 18 and the reference power source line 20 are both parts of the first wiring layer GM. The power source line 21 is part of the third wiring layer TM. It is desirable that the coupling line 23 is part of the first wiring layer GM.

It is desirable that the width of the control line 17 is greater than the width of the coupling line 23.

Moreover, although not illustrated, in an extension portion of the coupling line 23, the capacitive electrode 281 may be part of the first wiring layer GM, the capacitive electrode 281 may be part of the third wiring layer TM, or the capacitive electrode 281 may be part of both the first wiring layer GM and the third wiring layer TM. The capacitive electrode 282 is part of the second wiring layer SD.

Next, a method for controlling the image display device 1 according to the present disclosure will be described with reference to FIG. 6.

Figure 6:
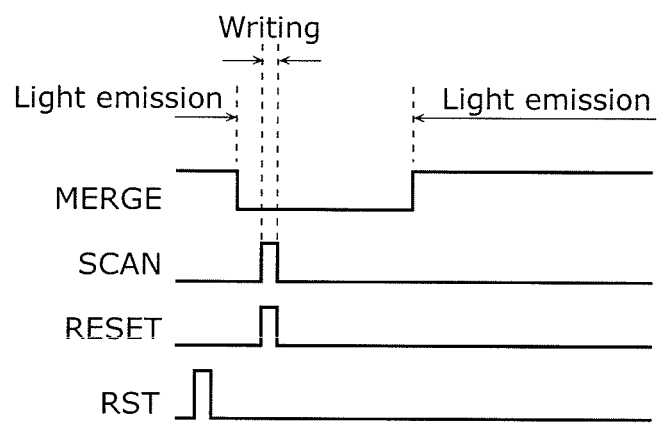
FIG. 6 is a timing chart showing an example of a control signal for driving the image display device according to Embodiment.

FIG. 6 is a timing chart of operation timing in the method for controlling the image display device according to Embodiment of the present disclosure. In FIG. 6, a horizontal axis denotes time. Moreover, in a vertical direction, signal waveforms each for the control signals MERGE, SCAN, RESET, and RST are shown.

The control circuit 2 changes the voltage level of the control signal RST from LOW to HIGH, and then turns on the switching transistor 25. At this time, the initialization voltage VREF2 is set to OFF voltage of the switching transistor 12, and the OFF voltage of the switching transistor 12 is set to the capacitive electrode 242 via the switching transistor 25. Although the voltage level of the control signal RST may be set once to HIGH for each frame, the voltage level of the control signal RST may be set a plurality of times and may be set once for several frames. The timing, for example, may be a light emission period or a blanking period. The controlling unit may be each row, each block which compiles a plurality of pixel rows, and an overall panel.

Moreover, when the preceding frame ends a light emission period, the scanning line driving circuit 4 changes the voltage level of the control signal MERGE from HIGH to LOW, and turns off the switching transistor 19. With this, the source of the driving transistor 14 and the electrode 132 of the electrostatic holding capacitor 13 are not conductive to each other.

When a writing period begins, the scanning line driving circuit 4 changes the voltage level of the control signal SCAN from Low to HIGH. Then, the voltage level of the control signal RESET also changes, via the capacitor 24, from LOW to HIGH, and the switching transistors 11 and 12 change to the ON state. With this, the reference voltage VREF of the reference power source line 20 is applied to the electrode 131 of the electrostatic holding capacitor 13, and the signal voltage Vdata is applied to the electrode 132 from the signal line 16.

Moreover, the source of the driving transistor 14 and the electrode 132 of the electrostatic holding capacitor 13 are not conductive to each other by turning off the switching transistor 19. Furthermore, the reference voltage VREF of the reference power source line 20 is applied to the gate of the driving transistor 14, and is set to a potential in which the driving transistor 14 is OFF. Therefore, at this time, since the source-drain current of the driving transistor 14 does not flow, the organic EL element 15 does not emit light.

In the writing period, since the voltage level of the control line 17 is HIGH, the signal voltage Vdata is applied from the signal line 16 to the electrode 132 of the pixel circuit 10. Similarly, the signal voltage is applied to each of the pixel circuits which belongs to a pixel row including the pixel circuit 10.

In the writing period, since only the electrostatic holding capacitor 13 that is a capacitive burden is connected to the reference power source line 20, a voltage drop caused by steady-state current does not occur. A potential difference between the drain and source of the switching transistor 12 is 0 V because charging current does not flow anymore after the electrostatic holding capacitor 13 has been charged. The same is true to the signal line 16 and the switching transistor 11. Therefore, the precise potentials VREF and Vdata that correspond to the signal voltage are written into the electrode 131 and the electrode 132 of the electrostatic holding capacitor 13, respectively.

When the writing period ends, the scanning line driving circuit 4 changes the voltage level of the control signal SCAN from HIGH to LOW (for example, VgL). Then, the voltage level of the control signal RESET also changes, via the capacitor 24, from HIGH to LOW (VREF2 in FIG. 4), and the switching transistors 11 and 12 change to the OFF state. With this, the electrode 131 of the electrostatic holding capacitor 13 and the reference power source line 20 are not conductive to each other, and the electrode 132 of the electrostatic holding capacitor 13 and the signal line 16 are not conductive to each other. In other words, a voltage set at the LOW level of the control signal SCAN can be different from that set at the LOW level of the control signal RESET.

Figure 7:
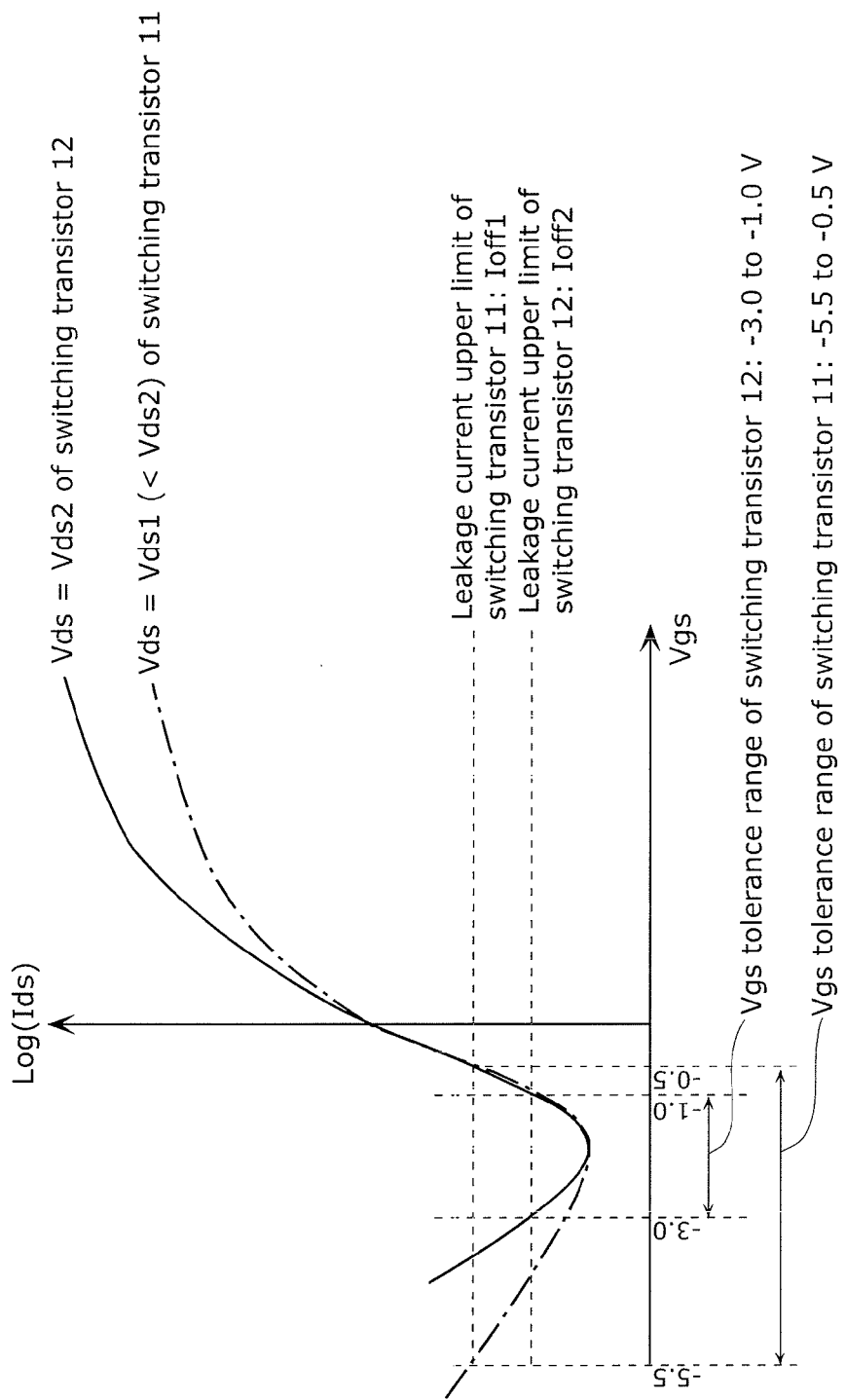
FIG. 7 is a block diagram showing an effect of the image display device according to Embodiment.

FIG. 7 shows a relationship between a drain-source current (Ids) and a gate-source voltage (Vgs) in a drain-source operation voltage (Vds) when the switching transistors 11 and 12 emit light.

When leakage current between the drain and the source that is acceptable for the switching transistor 11 is Ids=Ioff1, Vgs to be set at the switching transistor 11 is −5.5 to 0.5 V. When a condition of the leakage current between the drain and the source is Vs=0 V and Vs=5V (the minimum value of the data line voltage is set to 0 V and the maximum value of the data line voltage is set to 5 V), a range of Vg of the switching transistor 11 to be set is −5.5 to −0.5 V in the case of Vs=0V, and a range of the switching 11 to be set is −0.5 to 4.5 V in the case of Vs=5V. Therefore, Vg that is compatible with the two is −0.5 V. In other words, −0.5 V is a voltage value to be set as the LOW voltage level of the control signal SCAN.

Similarly, when leakage current between the drain and the source that is acceptable for the switching transistor 12 is Ids=Ioff2, Vgs to be set at the switching transistor 12 is −3.0 to −1.0 V. Here, when a condition of the leakage current between the drain and the source is Vs=4V (the reference voltage VREF is 4V), a range of Vg of the switching transistor 12 to be set is 1 to 3 V. In other words, the voltage in a range from 1 to 3 V is a voltage value to be set as the LOW voltage level of the control signal RESET. However, there is no voltage value to be set as the LOW voltage level of the control signal SCAN within the range.

In other words, due to electric characteristics of the pixel circuit and the transistor, there is a case where it is not possible to balance a voltage value to be set as the LOW voltage level of the control signal SCAN with a voltage value to be set as the LOW voltage level of the control signal RESET. In this case, by applying the present disclosure, a necessary voltage can be set independently for each of the control lines without increasing the number of output pins from the scanning line driving circuit 4.

When the light emission period begins, the scanning line driving circuit 4 changes the voltage level of the control signal MERGE from LOW to HIGH, and then changes the switching transistor 19 to the ON state. With this, the source of the driving transistor 14 and the electrode 132 of the electrostatic holding capacitor 13 are conductive to each other. Moreover, the electrode 131 of the electrostatic holding capacitor 13 is disconnected to the reference power source line 20, and the electrode 132 is disconnected to the signal line 16. Therefore, since the gate potential of the driving transistor 14 changes according to a change in the source potential and (VREF−Vdata) that is a voltage across the electrostatic holding capacitor 13 is applied to between the gate and the source, a signal current corresponding to (VREF−Vdata) flows in the organic EL element 15.

In the light emission period, (VREF−Vdata) that is a voltage across the electrostatic holding capacitor 13 continues to be applied to between the gate and the source, the signal current flows and the organic EL element 15 continues to emit light.

The period in which the above described operation is described corresponds to a frame period in which the light emission intensity is updated for all pixel circuits of the image display device 1. The above described operation is repeated for each frame.

It should be noted that the above describes that the control signal RST is set to HIGH when the initialization voltage VREF2 is set to OFF voltage of the switching transistor 12. The control signal RST may be set to HIGH when the initialization voltage VREF2 is set to ON voltage of the switching transistor 12.

As described above, in the image display device 1 and the method for controlling the image display device 1, since current flowing in the driving transistor is only via the light-emitting element, steady-state current does not flow in a power source line and a signal line. Therefore, it is possible to record a correct potential in both end electrodes of the electrostatic holding capacitor having a function of holding the voltage to be held between the gate and the source of the driving transistor, and it is possible to display an image with high definition which reflects an image signal.

Furthermore, even when the voltages suitable for controlling switching ON and OFF for each of the switching transistors 11 and 12 are different from each other, the above described operation is realized only when the scanning line driving circuit 4 provides the control signal SCAN of the control signals SCAN and RESET.

Therefore, the number of output pins of the scanning line driving circuit 4 does not have to be increased, and the connection between the scanning line driving circuit 4 and the pixel circuit 10 is simplified.

Figure 8:
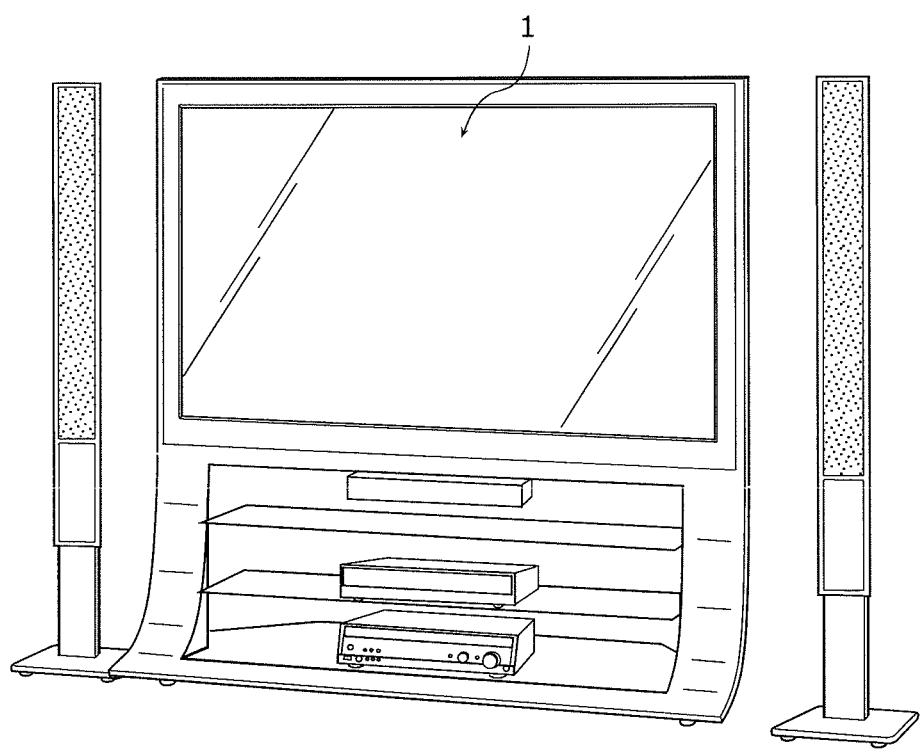
FIG. 8 is a block diagram showing an outline view of a flat panel television which includes an image display device according to Embodiment.
Figure 9:
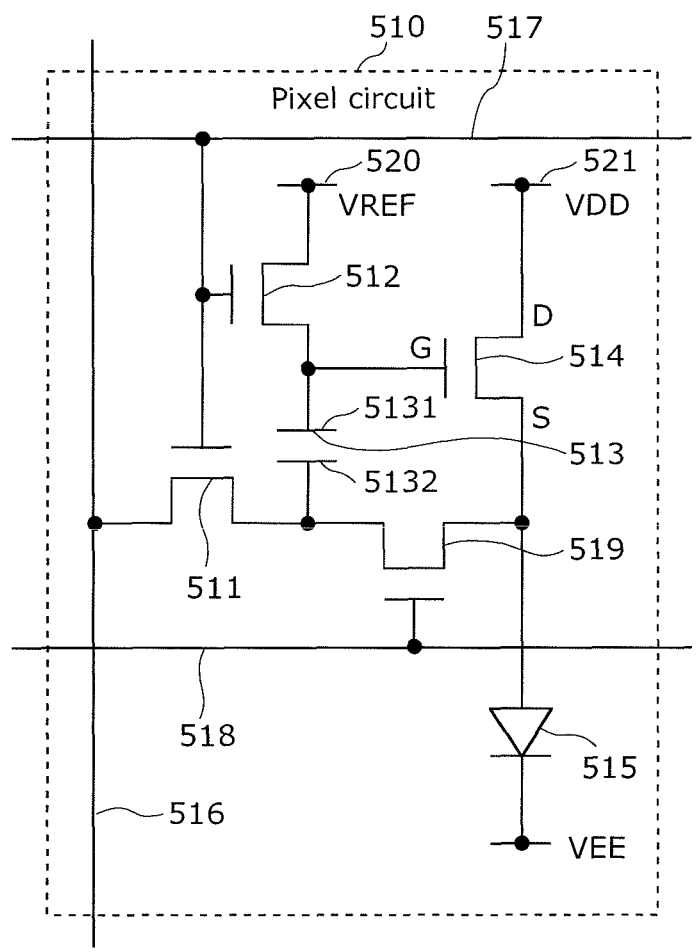
FIG. 9 is a circuit diagram showing an example of a pixel circuit in a conventional organic EL display device.

The image display device 1 according to the present disclosure is included in a flat panel television as shown in FIG. 8. The inclusion of the image display device according to the present disclosure makes it possible to realize a flat panel television capable of displaying high-definition images that reflect video signals.

Although the present disclosure in an aspect or aspects has been described by way of Embodiment above, it should be obvious that the present disclosure is not limited to Embodiment described above. Other embodiments implemented through various changes and modifications, conceived by those having ordinary skill in the art, made to Embodiments described above or through a combination of the structural elements in different Embodiments described above may be included in the scope in an aspect or aspects according to the present disclosure, unless such changes, modifications, and combination depart from the scope of the present disclosure.

INDUSTRIAL APPLICABILITY

The present disclosure is widely applicable as an image display device.

REFERENCE SIGNS LIST

1 Image display device
2 Control circuit
3 Memory
4 Scanning line driving circuit
5 Signal line driving circuit
6 Display unit
10 Pixel circuit
11, 12, 19, 25 Switching transistor
13 Electrostatic holding capacitor
14 Driving transistor
15 Organic EL element
16, 516 Signal line
17, 18, 27, 517 Control line
20, 520 Reference power source line
21 First power source line
22 Second power source line
23 Coupling line
24, 28 Capacitor
26 Initialization voltage line
29 Fixed voltage line
131, 132 Electrode
241, 242, 281, 282 Capacitive electrode
510 Pixel circuit
511, 512, 519 Switching element
513 Capacitor
514 Driving element
515 Light-emitting element
5131, 5132 Electrode

The invention claimed is:
1. A display device including a display in which a plurality of pixel circuits are disposed,
each of the pixel circuits including:
a driving transistor;
a first switching element;
a second switching element; and a control line that is connected to a gate electrode of the first switching element, and transmits a first control signal that controls switching ON and OFF of the first switching element, the display device comprising:
a first capacitive electrode that is directly connected to the control line; and
a second capacitive electrode that is opposite to the first capacitive electrode and is connected to a gate electrode of the second switching element,
wherein a first capacitor is formed between the first capacitive electrode and the second capacitive electrode, and
wherein the second switching element is connected to a gate electrode of the driving transistor.

2. The display device according to claim 1,
wherein switching ON and OFF of the second switching element are controlled according to a second control signal provided from the control line via the first capacitor.

3. The display device according to claim 1,
wherein the first capacitive electrode and the second capacitive electrode are provided to each of the pixel circuits.

4. The display device according to claim 2,
wherein the first switching element and the second switching element are transistors having a same conductivity type.

5. The display device according to claim 2,
wherein the first switching element and the second switching element are transistors having different conductivity types.

6. The display device according to claim 1, further comprising:
a coupling line which transmits the second control signal, wherein the second capacitive electrode is part of the coupling line;
a third capacitive electrode that is another part of the coupling line; and
a fourth capacitive electrode that is opposite to the third capacitive electrode and is connected to a fixed voltage line which transmits a fixed voltage,
wherein a second capacitor is formed between the third capacitive electrode and the fourth capacitive electrode.

7. The display device according to claim 6,
wherein a voltage amplitude of the gate electrode of the first switching element is greater than or equal to a voltage amplitude of the gate electrode of the second switching element.

8. The display device according to claim 1, further comprising:
a third switching element that switches between conduction and non-conduction between the second capacitive electrode and an initialization voltage line, which transmits an initialization voltage,
wherein in a period in which the initialization voltage is set to an ON voltage or an OFF voltage of the second switching element, the ON voltage or the OFF voltage of the second switching element is set to the second capacitive electrode by turning on the third switching element.

9. The display device according to claim 1, each of the pixel circuits including:

a driving transistor having one of a source electrode and a drain electrode that is connected to a first power source line that transmits a first power source voltage;
a capacitive element having one of electrodes that is connected to a gate electrode of the driving transistor;
a light-emitting element having one of electrodes that is connected to the other of the source electrode and the drain electrode of the driving transistor, and having the other of the electrodes that is connected to a second power source line, which transmits a second power source voltage;
a first switching transistor that switches between conduction and non-conduction between the other of the electrodes of the capacitive element and a data line, which transmits a data voltage corresponding to luminance;
a second switching transistor that switches between conduction and non-conduction between the one of the electrodes of the capacitive element and a reference voltage line, which transmits a reference voltage; and
a third switching transistor that switches between conduction and non-conduction between the source electrode of the driving transistor and the other of the electrodes of the capacitive element,
wherein the first switching element is the first switching transistor, and
the second switching element is the second switching transistor.

10. The display device according to claim 1,
wherein the display device has a structure in which a plurality of conductive layers are stacked, and
the first capacitive electrode and the second capacitive electrode are respective parts of a first conductive layer and a second conductive layer, the first conductive layer and the second conductive layer being adjacent to each other among the conductive layers.

11. The display device according to claim 6,
wherein the display device has a structure in which a plurality of conductive layers are stacked,
the first capacitive electrode and the second capacitive electrode are respective parts of a first conductive layer and a second conductive layer, the first conductive layer and the second conductive layer being adjacent to each other among the conductive layers,
the third capacitive electrode is part of the second conductive layer, and
the fourth capacitive electrode is part of the first conductive layer.

12. The display device according to claim 10,
wherein the first conductive layer is a second wiring layer, and the second conductive layer is a first wiring layer.

13. The display device according to claim 10,
wherein the first conductive layer is a second wiring layer, and the second conductive layer is a third wiring layer.

14. The display device according to claim 10,
wherein the control line is part of the first conductive layer,
the coupling line is part of the second conductive layer, and
the control line has a greater width than a width of the coupling line.

* * * * *